(12) United States Patent
Hsu

(10) Patent No.: US 11,128,284 B2
(45) Date of Patent: Sep. 21, 2021

(54) CONTROL CIRCUIT FOR CONTROLLING SIGNAL RISING TIME AND FALLING TIME

(71) Applicant: ALi Corporation, Hsinchu (TW)

(72) Inventor: Chih-Yuan Hsu, Hsinchu (TW)

(73) Assignee: ALi Corporation, Hsinchu (TW)

( * ) Notice: Subject to any disclaimer, the term of this patent is extended or adjusted under 35 U.S.C. 154(b) by 0 days.

(21) Appl. No.: 17/011,917

(22) Filed: Sep. 3, 2020

(65) Prior Publication Data

US 2021/0083657 A1 Mar. 18, 2021

(30) Foreign Application Priority Data

Sep. 12, 2019 (CN) .......................... 201910863132.X

(51) Int. Cl.
| | |
|---|---|
| *H03K 5/01* | (2006.01) |
| *H03K 3/037* | (2006.01) |
| *G06F 1/10* | (2006.01) |
| *H03K 19/20* | (2006.01) |
| *H03K 5/00* | (2006.01) |

(52) U.S. Cl.
CPC ................. *H03K 5/01* (2013.01); *G06F 1/10* (2013.01); *H03K 3/037* (2013.01); *H03K 19/20* (2013.01); *H03K 2005/00019* (2013.01)

(58) Field of Classification Search
None
See application file for complete search history.

(56) References Cited

U.S. PATENT DOCUMENTS

| | | | |
|---|---|---|---|
| 5,651,029 A | * 7/1997 | Yang | ................. H04L 25/03834 333/20 |
| 6,687,286 B1 | 2/2004 | Leonowich et al. | |
| 7,113,121 B1 | 9/2006 | Sutardja et al. | |
| 7,298,173 B1 | 11/2007 | Jiang et al. | |
| 7,848,402 B1 | * 12/2010 | Wang | ................. H04L 25/03878 375/232 |

* cited by examiner

*Primary Examiner* — Jeffery S Zweizig
(74) *Attorney, Agent, or Firm* — JCIPRNET

(57) ABSTRACT

A control circuit for controlling signal rising time and falling time is provided. The circuit includes multiple data flip-flops, multiple controllable delay circuits, and multiple current source circuits. The data flip-flops are triggered by clock signals to output a plurality of data signals. The controllable delay circuits delay the data signals, based on corresponding delay amounts, to generate a plurality of activation signals. Each of the current source circuits determines whether to output a unit current to a signal output terminal according to a level of one of the activation signals. Rising or falling time for an output signal of the signal output terminal to rise or fall to a predetermined level is determined according to a cycle time length of the clock signal and the delay amount of each of the controllable delay circuits.

11 Claims, 12 Drawing Sheets

US 11,128,284 B2

CONTROL CIRCUIT FOR CONTROLLING SIGNAL RISING TIME AND FALLING TIME

CROSS-REFERENCE TO RELATED APPLICATION

This application claims the priority benefit of China application serial no. 201910863132.X, filed on Sep. 12, 2019. The entirety of the above-mentioned patent application is hereby incorporated by reference herein and made a part of this specification.

BACKGROUND OF THE INVENTION

1. Field of the Invention

The disclosure relates to a circuit device, and more particularly, to a control circuit for controlling signal rising time and falling time.

2. Description of Related Art

As people increasingly rely on electronic products to deal with all kinds of tasks, functions of electronic products have become more and more complicated, and hence electromagnetic interference (EMI) has become an important issue in designing circuits for electronic products. For example, when a signal in a circuit is in rising edge (transition from low to high voltage level) or falling edge (transition from high to low voltage level), if the voltage level rises or falls sharply to a predetermined high or low level, it is easy to cause the EMI, thereby damaging electronic components in the circuit. Therefore, at least in light of reducing EMI, when a signal is in transition between logical high and low level, it is necessary to moderate the speed of the signal rising up or falling down to a predetermined level, that is, to control signal rising time and falling time to avoid the EMI. At present, when designing certain specific circuits, the rising time and the falling time are regulated by industrial standard specifications to ensure that the circuit may operate normally. For example, a three-level coding (MLT-3) circuit, a pulse amplitude modulation-5 (PAM-5) circuit or an HDMI interface circuit has a control circuit for controlling the rising time and the falling time of signals to ensure the signal transitions meet specification requirements. However, such control circuits may only adjust the rising time and the falling time symmetrically.

SUMMARY OF THE INVENTION

In view of this, the disclosure provides a control circuit for controlling signal rising time and falling time, which may adjust signal rising time or falling time asymmetrically and elastically.

An embodiment of the disclosure provides a control circuit for controlling signal rising and falling time. The control circuit includes series-connected M data flip-flops, M controllable delay circuits, and M current source circuits. The series-connected M data flip-flops receive a clock signal and are triggered by the clock signal to sequentially output a plurality of data signals. A data input terminal of the first data flip-flop of the M data flip-flops receives input data, and a data output terminal of the $N^{th}$ data flip-flop of the M data flip-flops is coupled to a data input terminal of the $(N+1)^{th}$ data flip-flop, where M and N are positive integers, and $1 \leq N < M$. The M controllable delay circuits are coupled to data output terminals of the foregoing M data flip-flops, receive the data signals, and delay generation of a plurality of activation signals. Herein, a delay amount of the $i^{th}$ controllable delay circuit is configured to delay the generation of one of the activation signals, where i is a positive integer less than or equal to M. The M current source circuits are coupled to a signal output terminal. Each of the current source circuits is coupled to one of the controllable delay circuits to receive one of the activation signals, and determines whether to output a unit current to a signal output terminal according to a level of the received one of the activation signals. Herein, rising time for an output signal of the signal output terminal to rise to a predetermined level or falling time for the output signal to fall to a predetermined level is determined according to a cycle time length of the clock signal and the delay amount of each of the controllable delay circuits.

Based on the above, in the embodiment of the disclosure, each data flip-flop outputs a corresponding data signal in response to being triggered by a clock signal. A controllable delay circuit is coupled between each data flip-flop and a corresponding current source circuit, and the controllable delay circuits are configured to delay the data signals to delay time for the current source circuit to provide a unit current to a signal output terminal. Herein, delay amounts of the controllable delay circuits may determine rising time or falling time of an output signal output by the signal output terminal separately, thereby asymmetrically adjusting the rising time for the output signal to rise to a predetermined level and the falling time for the output signal to fall to a predetermined level.

In order to make the aforementioned and other objectives and advantages of the invention comprehensible, embodiments accompanied with figures are described in detail below.

DESCRIPTION OF THE EMBODIMENTS

Figure 1:
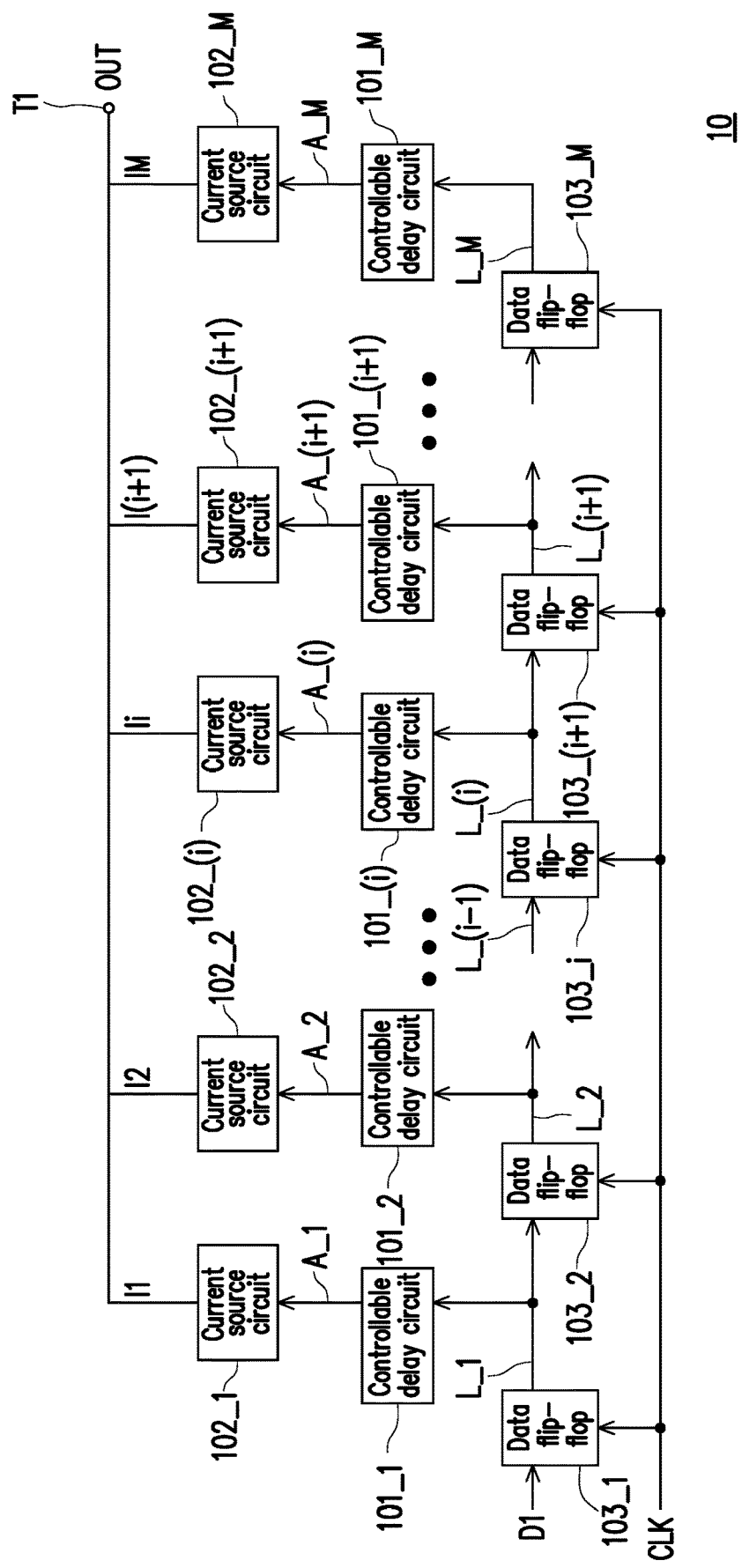
FIG. 1 is a schematic diagram of a control circuit for controlling rising time and falling time according to an embodiment of the disclosure.

Reference will now be made in detail to the present preferred embodiments of the invention, examples of which are illustrated in the accompanying drawings. Wherever possible, the same reference numbers are used in the drawings and the embodiments to refer to the same or like parts or components.

FIG. 1 is a schematic diagram of a control circuit for controlling signal rising time and falling time according to an embodiment of the disclosure. Referring to FIG. 1, a control circuit 10 for controlling signal rising time and falling time includes series-connected M data flip-flops 103_1, 103_2, . . . , 103_(i), 103_(i+1), . . . , 103_M, M controllable delay circuits 101_1, 101_2, . . . , 101_(i), 101_(i+1), . . . , 101_M, and M current source circuits 102_1, 102_2, . . . , 102_(i), 102_(i+1), . . . , 102_M. M is an integer greater than 1. The data flip-flops 103_1-103_M are connected in series, and the data flip-flops 103_1-103_M receive a clock signal CLK respectively and being triggered by the clock signal CLK to sequentially output a plurality of data signals L_1, L_2, . . . , L_(i), L_(i+1), . . . , L_M, where i is a positive integer less than M.

As shown in FIG. 1, a data input terminal of the first data flip-flop 103_1 in the data flip-flops 103_1-103_M receives input data D1. A data output terminal of the $N^{th}$ data flip-flop of the data flip-flops 103_1-103_M is coupled to a data input terminal of the $(N+1)^{th}$ data flip-flop of the data flip-flops 103_1-103_M, where N is a positive integer less than M. For example, a data output terminal of the first data flip-flop 103_1 is coupled to a data input terminal of the second data flip-flop 103_2, a data output terminal of the $i^{th}$ data flip-flop 103_(i) is coupled to a data input terminal of the $(i+1)^{th}$ data flip-flop 103_(1+1), and so on. Each of the data flip-flops 103_1-103_M includes a clock terminal, a data input terminal and a data output terminal. The data flip-flop is, for example, a D-type flip-flop. In response to edge triggering (rising edge triggering or falling edge triggering) of the clock signal CLK, each of data flip-flops 103_1-103_M outputs data received by the data input terminal thereof to the data output terminal thereof.

The controllable delay circuits 101_1-101_M are coupled to the corresponding data flip-flops 103_1-103_M respectively to receive the corresponding data signals L_1-L_M respectively. The controllable delay circuits 101_1-101_M delay the data signals L_1-L_M respectively to generate a plurality of activation signals A_1, A_2, . . . , A_(i), A_(i+1), . . . , A_M. Each of the controllable delay circuits 101_1-101_M is configured to delay one of the data signals L_1-L_M to generate one of the activation signals A_1-A_M. As shown in FIG. 1, a delay amount of the $i^{th}$ controllable delay circuit 101_(i) is configured to delay the data signal L_(i) to generate the activation signal A_(i). The controllable delay circuits 101_1-101_M may be delay buffers or other types of delay circuits, which are not limited in the disclosure.

The current source circuits 102_1-102_M are coupled to a signal output terminal T1. Each of the current source circuits 102_1-102_M is coupled to one of the controllable delay circuits 101_1-101_M and receives one of the corresponding activation signals A_1-A_M. For example, the second current source circuit 102_2 is coupled to the second controllable delay circuit 101_2 to receive the activation signal A_2. The current source circuits 102_1-102_M determine whether to output unit currents I1, I2, . . . , Ii, I(i+1), . . . , IM to the signal output terminal T1 according to levels of the activation signals A_1-A_M, respectively. In the embodiment of the disclosure, the current source circuits 102_1-102_M may sequentially output the unit currents I1-IM in response to level switching of the activation signals A_1-A_M, so that an output signal OUT gradually rises to a high level corresponding to logic '1'. Conversely, the current source circuits 102_1-102_M sequentially stop outputting the unit currents I1-IM in response to level switching of the activation signals A_1-A_M, so that the output signal OUT gradually falls to a low level corresponding to logic '0'.

It is to be noted that since the activation signals A_1-A_M are generated by delaying the data signals L_1-L_M, time for each of the current source circuits 102_1-102_M to output the unit currents I1-IM or time for each of the current source circuits to stop outputting the unit currents I1-IM are also delayed. Furthermore, since the output signal OUT is a superposition of the unit currents I1-IM, rising time for the output signal OUT of the signal output terminal T1 to rise to a predetermined level or falling time for the output signal to fall to a predetermined level may be determined according to the delay amounts of the controllable delay circuits 101_1-101_M and a cycle time length of the clock signal. Therefore, in the embodiment of the disclosure, by adjusting the delay amounts of the controllable delay circuits 101_1-101_M, the rising time or falling time of the output signal OUT may be prolonged or shortened.

In the embodiment of the disclosure, the delay amounts of the controllable delay circuits 101_1-101_M may be different from each other. For example, the delay amount of the first controllable delay circuit 101_1 may be different from the delay amounts of the other controllable delay circuits 101_2-101_M. It thus can be seen that by configuring the delay amounts of the controllable delay circuits 101_1-101_M, a waveform of the output signal OUT may be adjusted, so that the output signal OUT may more closely meet an actual demand. Furthermore, since the delay amounts of the controllable delay circuits 101_1-101_M are different from each other, the rising time and falling time of the output signal OUT may also depend on different delay amounts of the controllable delay circuits 101_1-101_M.

It is worth mentioning that in the embodiment of the disclosure, the delay amount of the $i^{th}$ controllable delay circuit 101_(i) may be less than the delay amount of the $(i+1)^{th}$ controllable delay circuit 101_(i+1). Alternatively, in the embodiment of the disclosure, the delay amount of the $i^{th}$ controllable delay circuit 101_(i) may be greater than the delay amount of the $(i+1)^{th}$ controllable delay circuit 101_(i+1). In other words, the delay amounts of the controllable delay circuits 101_1-101_M may be configured in a manner of gradually increasing or decreasing in proportional or non-proportional. Specifically, in the embodiment where the delay amounts of the controllable delay circuits 101_1-101_M are gradually increased, rising delay time or falling delay time of the output signal may be prolonged. In contrast, in the embodiment where the delay amounts of the controllable delay circuits 101_1-101_M are gradually decreased, rising delay time or falling delay time of the output signal may be prolonged.

Figure 2A:
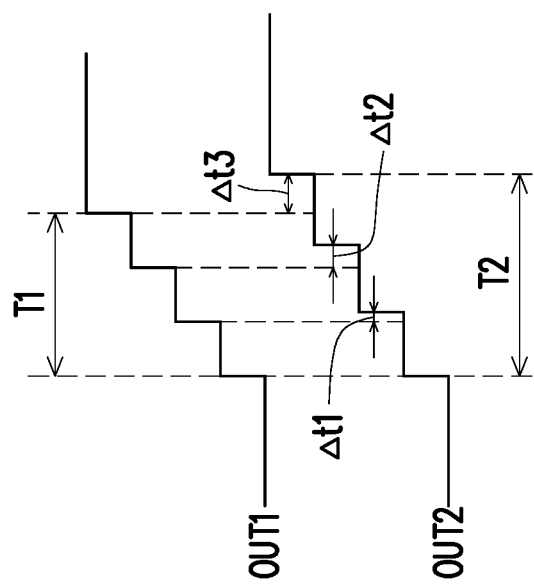
FIG. 2A is a waveform diagram of prolonging rising time according to an embodiment of the disclosure.

With reference to FIG. 2A, FIG. 2A is a waveform diagram of prolonging rising time according to an embodiment of the disclosure. It is assumed that M=4, an output signal OUT1 is an output result of the controllable delay circuits 101_1-101_M using the same delay amount, that is, each of the current sources 102_1-102_M outputs a unit current in response of driving of the activation signals A_1-A_M generated by delaying the data signals L_1-L_M using the same delay amount (assumed to be Δt0). Under the condition, the output signal OUT1 rises regularly in response to the gradual superposition of the unit currents, and rising time is T1. In contrast, an output signal OUT2 is an output result of the controllable delay circuits 101_1-

101_M configured to delay the data signals L_1-L_M using different delay amounts, and the delay amounts of the controllable delay circuits 101_1-101_M are gradually increased, where the delay amounts are Δt0, (Δt0+Δt1), (Δt0+Δt2), and (Δt0+Δt3), respectively, and Δt1<Δt2<Δt3. Under the condition, rising time of the output signal OUT2 is T2 greater than T1.

Figure 2B:
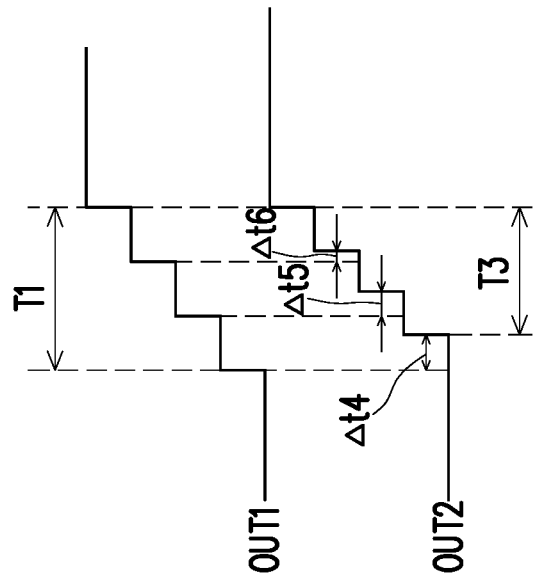
FIG. 2B is a waveform diagram of shortening rising time according to an embodiment of the disclosure.

With reference to FIG. 2B, FIG. 2B is a waveform diagram of shortening rising time according to an embodiment of the disclosure. Similarly, it is assumed that M=4, an output signal OUT1 is the same as the output signal OUT1 in FIG. 2A, which is an output result of the controllable delay circuits 101_1-101_M using the same delay amount, that is, each of the current sources 102_1-102_M outputs a unit current in response of driving of the activation signals A_1-A_M generated by delaying the data signals L_1-L_M using the same delay amount Δt0. Therefore, the output signal OUT1 rises regularly in response to the gradual superposition of the currents, and rising time is T1. An output signal OUT3 is an output result of the controllable delay circuits 101_1-101_M configured to delay the data signals L_1-L_M, and the delay amounts of the controllable delay circuits 101_1-101_M are gradually decreased, where the delay amounts are (Δt0+Δt4), (Δt0+Δt5), (Δt0+Δt6), and Δt0, respectively, and Δt4>Δt5>Δt6. Under the condition, the rising time of the output signal OUT2 is T3 less than T1.

In addition, in the embodiment of the disclosure, the controllable delay circuits 101_1-101_M may generate the activation signals A_1-A_M by delaying time for the data signals L_1-L_M to be switched from a low level to a high level after the controllable delay circuits 101_1-101_M receives the data signals L_1-L_M. Alternatively, the controllable delay circuits 101_1-101_M may also generate the activation signals A_1-A_M by delaying time for the data signals L_1-L_M to be switched from a high level to a low level. The delay amount of delaying the switching of the data signals L_1-L_M from a low level to a high level and the delay amount of delaying the switching of the data signals L_1-L_M from a high level to a low level may be differently set in the controllable delay circuits 101_1-101_M. Accordingly, the rising time and falling time of the output signal OUT may be independently adjusted by means of the settings of the controllable delay circuits 101_1-101_.

Figure 3:
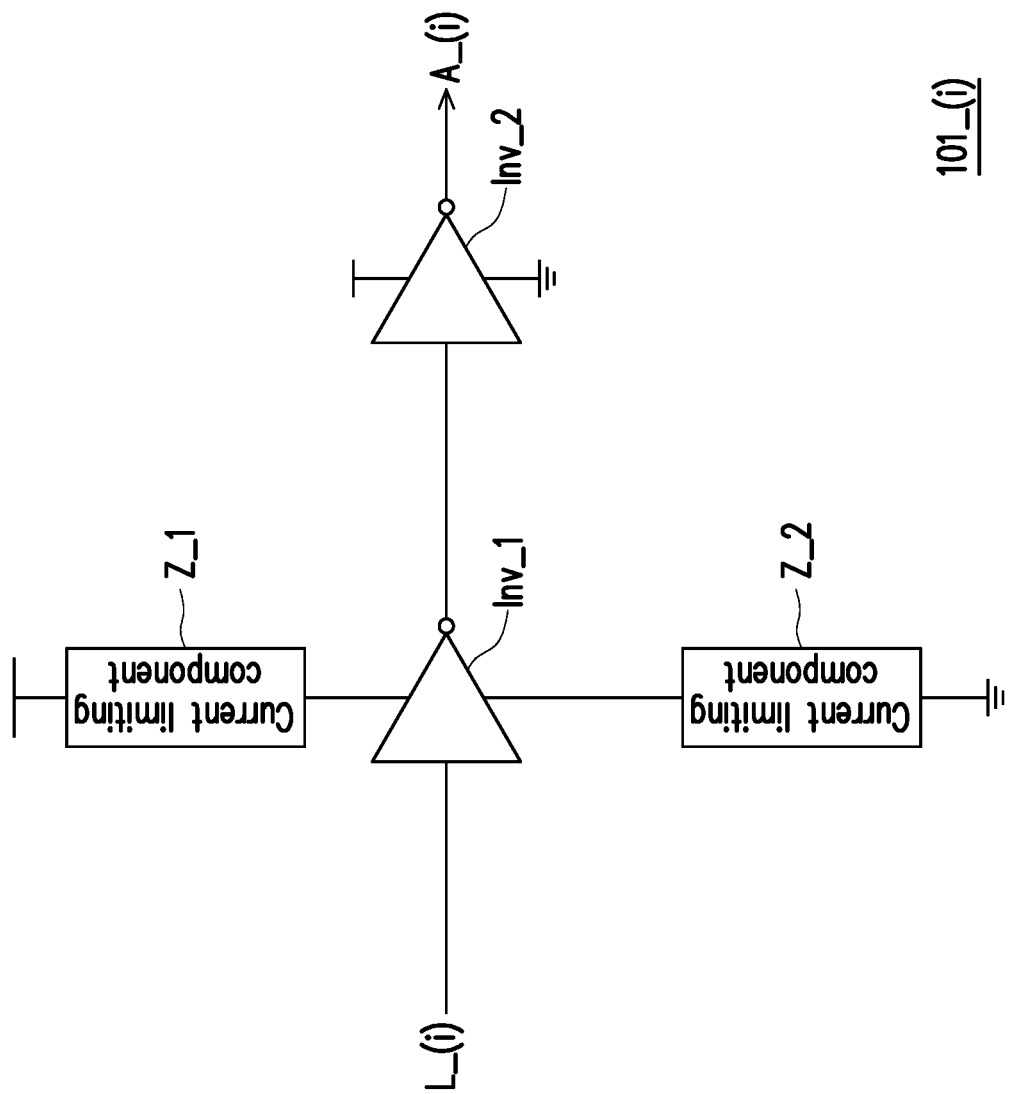
FIG. 3 is a schematic diagram of a controllable delay circuit according to an embodiment of the disclosure.

FIG. 3 is a schematic diagram of a controllable delay circuit according to an embodiment of the disclosure. Referring to FIG. 3, the $i^{th}$ controllable delay circuit 101_(i) may include a first current limiting component Z_1, a second current limiting component Z_2, and a delay buffer. The delay buffer may include a first inverter Inv_1 and a second inverter Inv_2. However, in other embodiments, the $i^{th}$ controllable delay circuit 101_(i) may include other designed delay buffers, such as a first inverter and a buffer, and the disclosure is not limited thereto. The delay buffer may switch the levels of the data signals L_1-L_M through the inverters, and the current limiting component determines the magnitude of a driving current of the delay buffer.

In an embodiment, since the first current limiting component Z_1 and the second current limiting component Z_2 may be configured to determine the magnitude of the driving current of the delay buffer, the rising time for the output signal OUT to rise to a predetermined level and the falling time for the output signal to fall to a predetermined level may be controlled independently and separately. Specifically, one of the first current limiting component Z_1 and the second current limiting component Z_2 may be configured to control the rising time for the output signal OUT to rise to a predetermined level, and the other one of the first current limiting component Z_1 and the second current limiting component Z_2 may be configured to control the falling time for the output signal OUT to fall to a predetermined level.

In the embodiment shown in FIG. 3, an output terminal of the first inverter Inv_1 is coupled to an input terminal of the second inverter Inv_2. An input terminal of the first inverter Inv_1 receives one of the data signals L_1-L_M (i.e., data signal L_(i)), and an output terminal of the second inverter Inv_2 outputs one of the activation signals A_1-A_M (i.e., activation signal A_(i)). A first power terminal of the first inverter Inv_1 is coupled to the first current limiting component Z_1. A second power terminal of the first inverter Inv_1 is coupled to the second current limiting component Z_2. The first current limiting component Z_1 may be a component capable of affecting the magnitude of a current such as an adjustable resistor, an adjustable current or an adjustable capacitor. Similarly, the second current limiting component Z_2 may be a component capable of affecting the magnitude of a current such as an adjustable resistor, an adjustable current source or an adjustable capacitor.

In the embodiment of the disclosure, the first current limiting component Z_1 and the second current limiting component Z2 are configured to determine the magnitude of a driving current of the first inverter Inv_1, thereby determining delay time between the activation signal A_(i) and the data signal L_(i), that is, a delay amount. In other words, the delay amount of the controllable delay circuit 101_(i) may depend on impedance values, controllable current magnitudes or capacitance values of the first current limiting component Z_1 and the second current limiting component Z_2. Thus, it can be seen that the delay amount of each of the controllable delay circuits 101_1-101_M is adjustable by adjusting the impedance value, controllable current magnitude or capacitance value of each of the current limiting components. In an embodiment, the magnitude of the driving current of the first inverter Inv_1 is controlled by adjusting the switch-on or switch-off of a transistor in each of the current limiting components Z_1 and Z_2, so that the delay amount of each of the controllable delay circuits 101_1-101_M is adjustable. It is to be noted that although FIG. 3 is illustrated with an example in which the controllable delay circuit 101_(i) is a delay buffer including the first current limiting component Z_1 and the second current limiting component Z_2, the disclosure is not limited thereto. In other embodiments, the controllable delay circuit 101_(i) may be a delay buffer including only the first current limiting component Z_1 or the second current limiting component Z_2. In addition, in other embodiments, a connection order of the first inverter Inv_1 and the second inverter Inv_2 may also be reversed, so that the input terminal of the second inverter Inv_2 receives the data signal L_(i), and the output terminal thereof is coupled to the input terminal of the first inverter Inv_1. The output terminal of the first inverter Inv_1 is configured to output the activation signal A_(i).

In the present embodiment, when the delay buffer is configured to delay transition time for the data signal L_(i) to be switched from a low level to a high level, the delay amount may be determined by a current limiting component coupled to an operating power supply (VDD) such as the first current limiting component Z_1 shown in FIG. 3. Conversely, when the delay buffer is configured to delay transition time for the data signal L_(i) to be switched from a high level to a low level, the delay amount may be controlled by a current limiting component coupled to a ground power supply (GND) such as the second current limiting component Z_2 shown in FIG. 3.

Figure 4A:
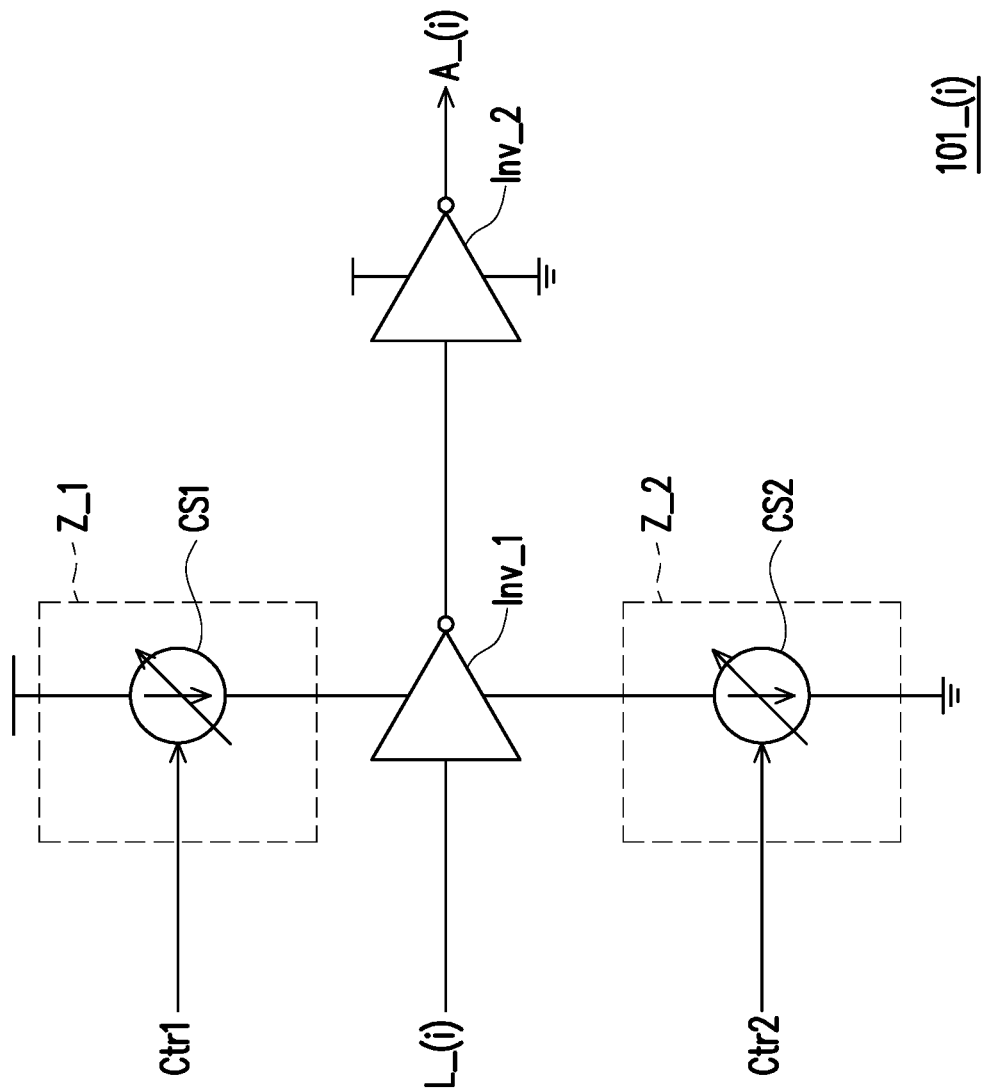
FIG. 4A to FIG. 4C are schematic diagrams of a controllable delay circuit according to an embodiment of the disclosure.
Figure 4B:
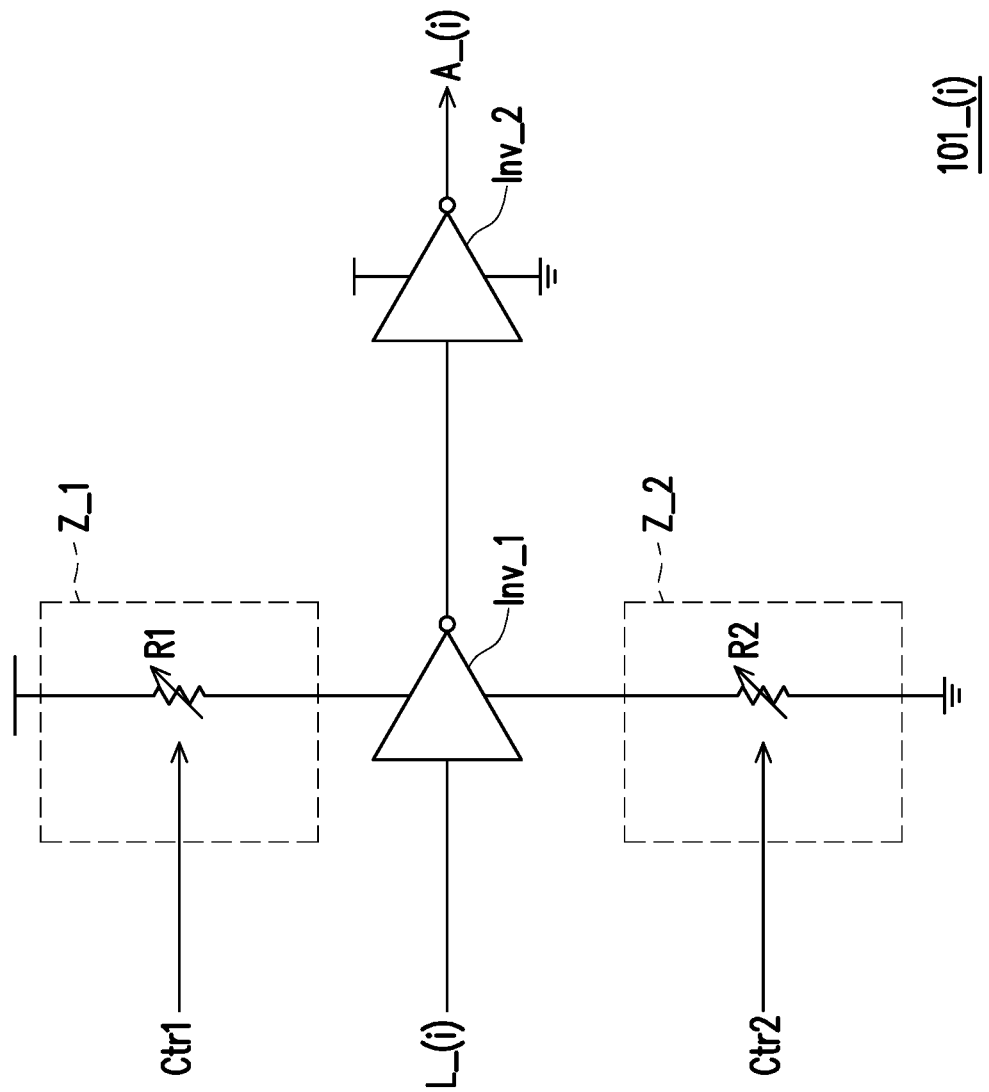
Figure 4C:
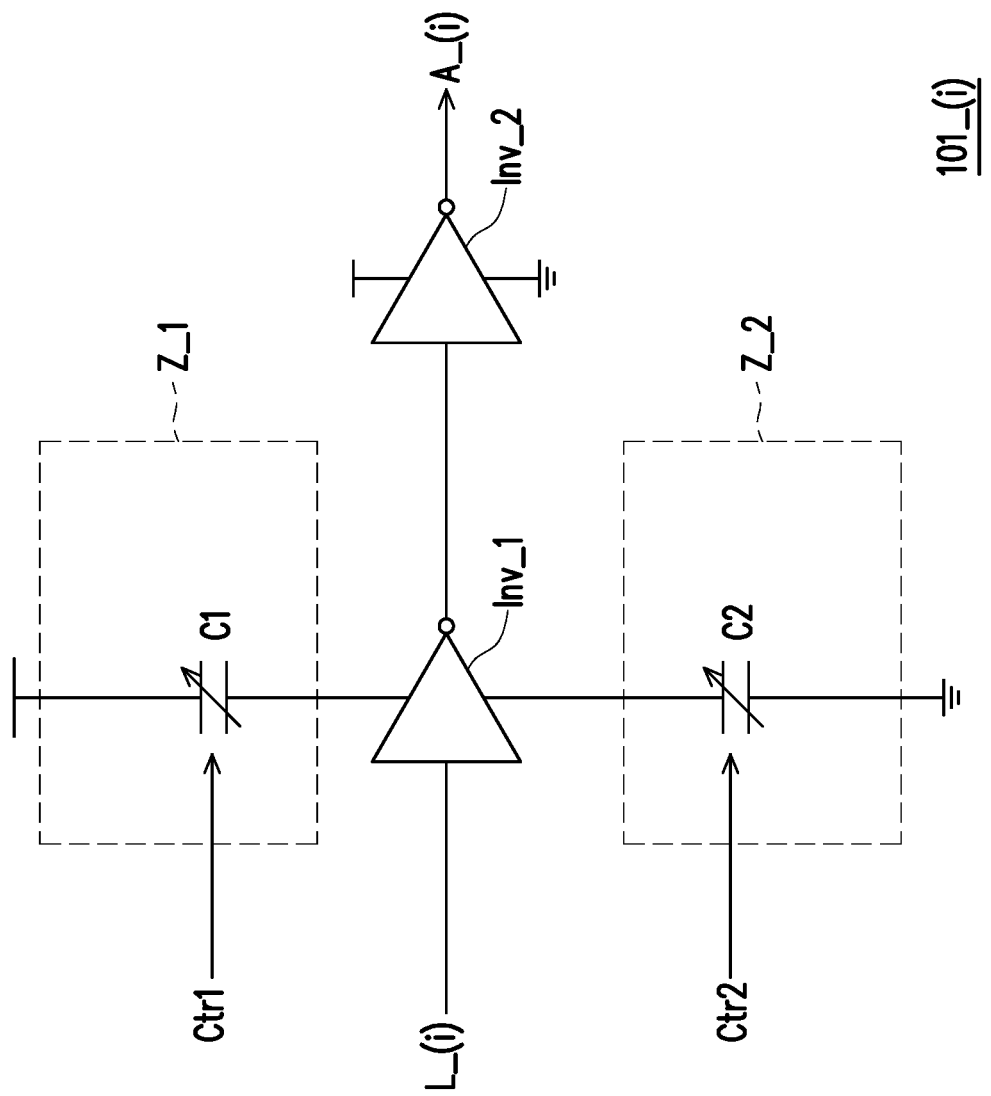

FIG. 4A to FIG. 4C are schematic diagrams of a controllable delay circuit according to an embodiment of the disclosure. Referring to FIG. 4A, the first current limiting component Z1 may include a controllable current source CS1, and the second current limiting component Z2 may include a controllable current source CS2. Control terminals of the controllable current source CS1 and the controllable current source CS2 are coupled to a first control signal Ctr1 and a second control signal Ctr2, respectively. In the embodiment of the disclosure, an output current value of the controllable current source CS1 or the controllable current source CS2 may be changed by the first control signal Ctr1 and the second control signal Ctr2, respectively, so that delay time for the output terminal of the first inverter Inv_1 to output a signal is adjustable. Accordingly, the delay amount of the controllable delay circuit 101_(i) may depend on the output current value of the controllable current source CS1 or the controllable current source CS2.

Referring to FIG. 4B, the first current limiting component Z1 may include a variable resistor R1, and the second current limiting component Z2 may include a variable resistor R2. Similarly, in the embodiment of the disclosure, a resistance value of the variable resistor R1 or the variable resistor R2 is changed by the first control signal Ctr1 and the second control signal Ctr2, respectively, so that delay time for the output terminal of the first inverter Inv_1 to output a signal is adjustable. Accordingly, the delay amount of the controllable delay circuit 101_(i) may depend on the resistance value of the variable resistor R1 or the variable resistor R2.

Referring to FIG. 4C, the first current limiting component Z1 may include a variable capacitor C1, and the second current limiting component Z2 may include a variable capacitor C2. Delay time for the output terminal of the first inverter Inv_1 to output a signal may be determined by changing a capacitance value of the variable capacitor C1 or the variable capacitor C2.

Herein, although the above exemplary embodiment only describes the circuit structure and operation principle of the $i^{th}$ controllable delay circuit 101_(i), the circuit structure and operation principle of the remaining controllable delay circuits are similar to those of the $i^{th}$ controllable delay circuit 101_(i) and the descriptions thereof are omitted herein.

Figure 5:
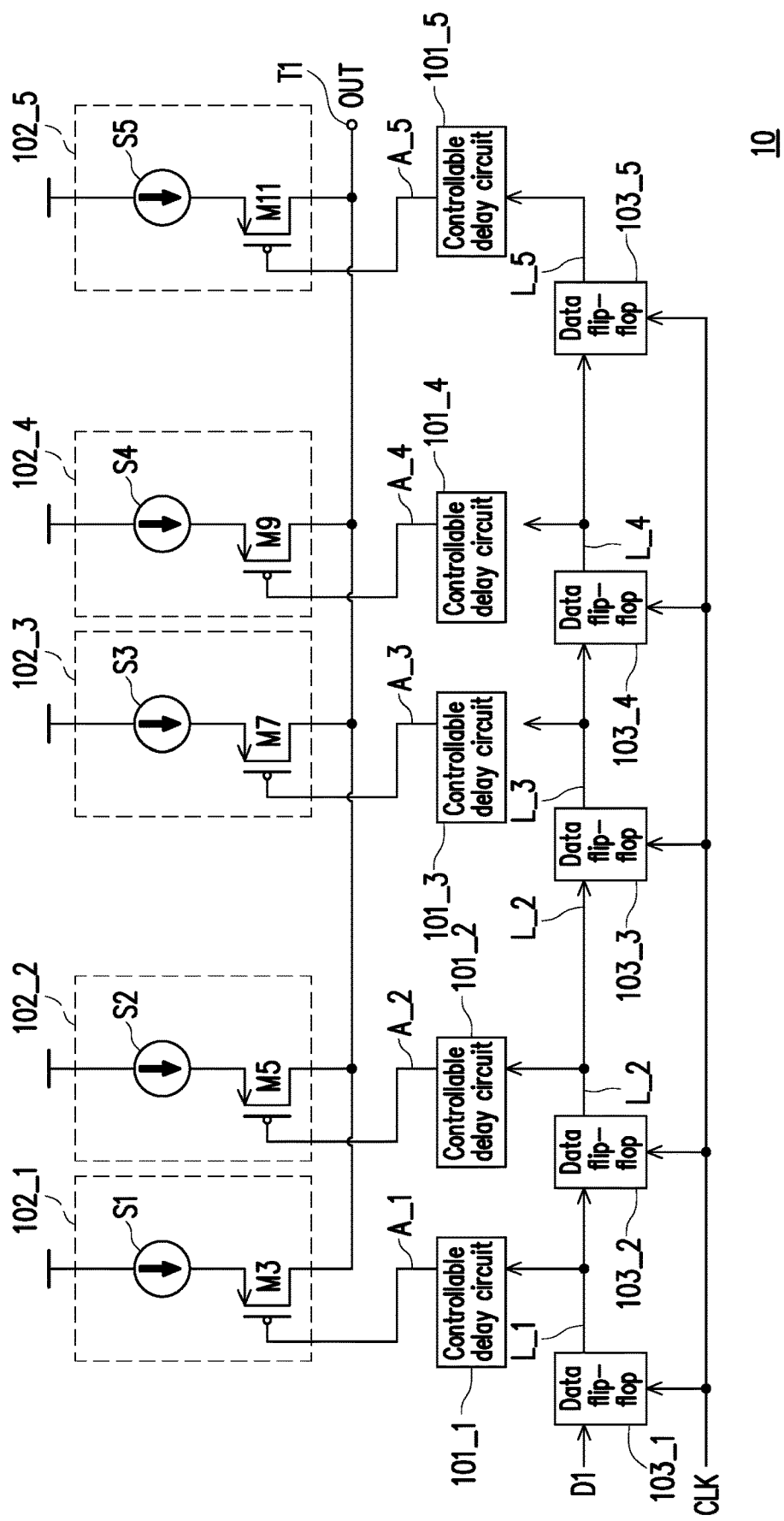
FIG. 5 is a schematic diagram of a control circuit for controlling rising time and falling time according to an embodiment of the disclosure.

The following is described with an example that the output signal OUT is generated by superposing five unit currents I1-I5 (i.e., M=5). With reference to FIG. 5, FIG. 5 is a schematic diagram of a control circuit for controlling rising time and falling time according to an embodiment of the disclosure.

Data flip-flops 103_1-103_5 respectively receive a clock signal CLK, and are cyclic triggered by the clock signal CLK to sequentially output data of data input terminals to data output terminals. In other words, data signals L_1-L_5 are generated according to input data D1 and the clock signal CLK. The data flip-flop 103_1 outputs the data signal L_1 to the data flip-flop 103_2, the data flip-flop 103_2 outputs the data signal L_2 to the data flip-flop 103_2, and so on. In addition, the data flip-flops 103_1-103_5 output the data signals L_1-L_5 to controllable delay circuits 101_1-101_5, respectively.

The controllable delay circuits 101_1-101_5 may generate activation signals A_1-A_5 by delaying transition time of the data signals L_1-L_5. In detail, the controllable delay circuits 101_1-101_5 may respectively generate activation signals A_1-A_5 by delaying time for the data signals L_1-L_5 to be switched from a low level to a high level. Alternatively, the controllable delay circuits 101_1-101_5 generate activation signals A_1-A_5 by delaying the data signals L_1-L_5 to be switched from a high level to a low level.

Current source circuits 102_1-102_5 are coupled to the controllable delay circuits 101_1-101_5, respectively. Each of the current source circuits 102_1-102_5 includes a switch and a current source. For example, the current source circuit 102_1 includes a switch M3 and a current source S1. The current source circuit 102_2 includes a switch M5 and a current source S2. The current source circuit 102_3 includes a switch M7 and a current source S3. The current source circuit 102_4 includes a switch M9 and a current source S4. The current source circuit 102_5 includes a switch M11 and a current source S5. In the present embodiment, the switches M3, M5, M7, M9, and M11 are p-channel metal oxide semiconductor (PMOS) transistors. In addition, the current sources S1-S5 may be obtained by a current mirror circuit.

The current source circuit 102_1 is taken for description. A control terminal of the switch M3 receives the activation signal A_1 and thus is controlled by the activation signal A_1. Therefore, when the switch M3 is turned on according to the activation signal A_1, a unit current provided by the current source S1 is output to the output terminal T1. It is to be noted that turn-on time of the switch M3 depends on the delay amount of the controllable delay circuit 101_1. The other current source circuits 102_2-102_4 will also operate in the same manner.

Therefore, when the controllable delay circuits 101_1-101_5 generate activation signals A_1-A_5 by delaying time for the data signals L_1-L_5 to rise to a high level from a low level to generate the activation signals A_1-A_5, turn-off timing of the transistors M3, M5, M7, M9, and M11 is sequentially delayed, and therefore the falling time of the output signal OUT is adjusted accordingly. It is to be noted that in the case of sequentially increasing the delay amounts of the controllable delay circuits 101_1-101_5, a delayed amplitude of the turn-off time of the transistors M3, M5, M7, M9, and M11 is increasing, and therefore the falling delay time of the output signal OUT is prolonged accordingly. In the case of sequentially decreasing the delay amounts of the controllable delay circuits 101_1-101_5, the delayed amplitude of the turn-off timing of the transistors M3, M5, M7, M9, and M11 is decreasing, and therefore the falling delay time of the output signal OUT is shortened accordingly.

In addition, when the controllable delay circuits 101_1-101_5 delay time for the data signals L_1-L_5 to fall to a low level from a high level to generate the low-level activation signals A_1-A_5, turn-on timing of the transistors M3, M5, M7, M9, and M11 is sequentially delayed, and the rising time of the output signal OUT is adjusted accordingly. It is to be noted that in the case of sequentially increasing the delay amounts of the controllable delay circuits 101_1-101_5, a delayed amplitude of the turn-on time of the transistors M3, M5, M7, M9, and M11 is increasing, and therefore the rising delay time of the output signal OUT is prolonged accordingly. In addition, in the case of sequentially decreasing the delay amounts of the controllable delay circuits 101_1-101_5, the delayed amplitude of the turn-on timing of the transistors M3, M5, M7, M9, and M11 is decreasing, and therefore the rising delay time of the output signal OUT is shortened accordingly.

It thus can be seen that the rising delay time and falling delay time of the output signal OUT may be independently adjusted. When the delay amounts of the controllable delay circuits 101_1-101_5 are gradually increased or gradually decreased, the rising delay time or the falling delay time will be prolonged or shortened.

Figure 6:
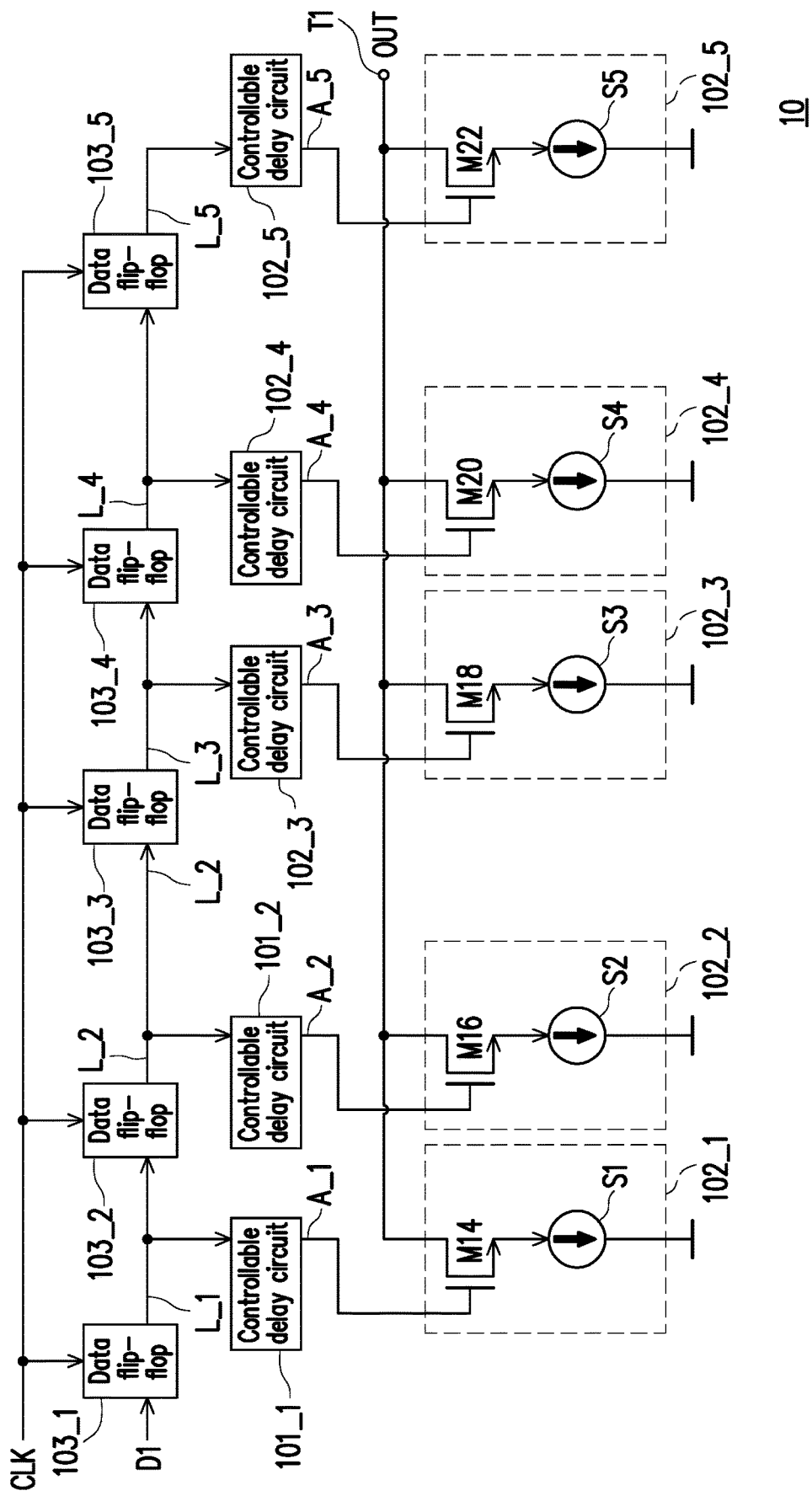
FIG. 6 is a schematic diagram of a control circuit for controlling rising time and falling time according to an embodiment of the disclosure.

With reference to FIG. 6, FIG. 6 is a schematic diagram of a control circuit for controlling rising time and falling time according to an embodiment of the disclosure. In the descriptions of the embodiment of FIG. 6, it is also assumed that M=5. It is to be noted that the difference between FIG. 5 and FIG. 6 lies in that switches M14, M16, M18, M20, and M22 in the current source circuits 102_1-102_5 are N-channel metal oxide semiconductor (NMOS) transistors. The action of a circuit shown in FIG. 6 may be inferred by those skilled in the art with reference to the descriptions of FIG. 1 to FIG. 5.

It is to be noted that when the controllable delay circuits 101_1-101_5 output the high-level activation signals A_1-A_5 by delaying time for the data signals L_1-L_5 to rise to a high level from a low level, turn-on timing of the transistors M14, M16, M18, M20, and M22 is sequentially delayed, and the rising time of the output signal OUT is adjusted accordingly. It is to be noted that in the case of sequentially increasing the delay amounts of the controllable delay circuits 101_1-101_5, a delayed amplitude of the turn-on time of the transistors M14, M16, M18, M20, and M22 is increasing, and therefore the rising delay time of the output signal OUT is prolonged accordingly. In the case of sequentially decreasing the delay amounts of the controllable delay circuits 101_1-101_5, the delayed amplitude of the turn-on timing of the transistors M14, M16, M18, M20, and M22 is decreasing, and therefore the rising delay time of the output signal OUT is shortened accordingly.

In addition, when the controllable delay circuits 101_1-101_5 generate activation signals A_1-A_5 by delaying time for the data signals L_1-L5 to fall to a low level from a high level to output the low-level activation signals A_1-A_5, turn-off timing of the transistors M14, M16, M18, M20, and M22 is sequentially delayed, and the falling time of the output signal OUT is adjusted accordingly. It is to be noted that in the case of sequentially increasing the delay amounts of the controllable delay circuits 101_1-101_5, a delayed amplitude of the turn-off timing of the transistors M14, M16, M18, M20, and M22 is increasing, and therefore the falling delay time of the output signal OUT is prolonged accordingly. In the case of sequentially decreasing the delay amounts of the controllable delay circuits 101_1-101_5, the delayed amplitude of the turn-off timing of the transistors M14, M16, M18, M20, and M22 is decreasing, and therefore the falling delay time of the output signal OUT is shortened accordingly.

It thus can be seen that the rising time and falling time of the output signal OUT may be independently adjusted. When the delay amounts of the controllable delay circuits 101_1-101_5 are gradually increased or gradually decreased, the rising delay time or the falling delay time will be prolonged or shortened.

Figure 7:
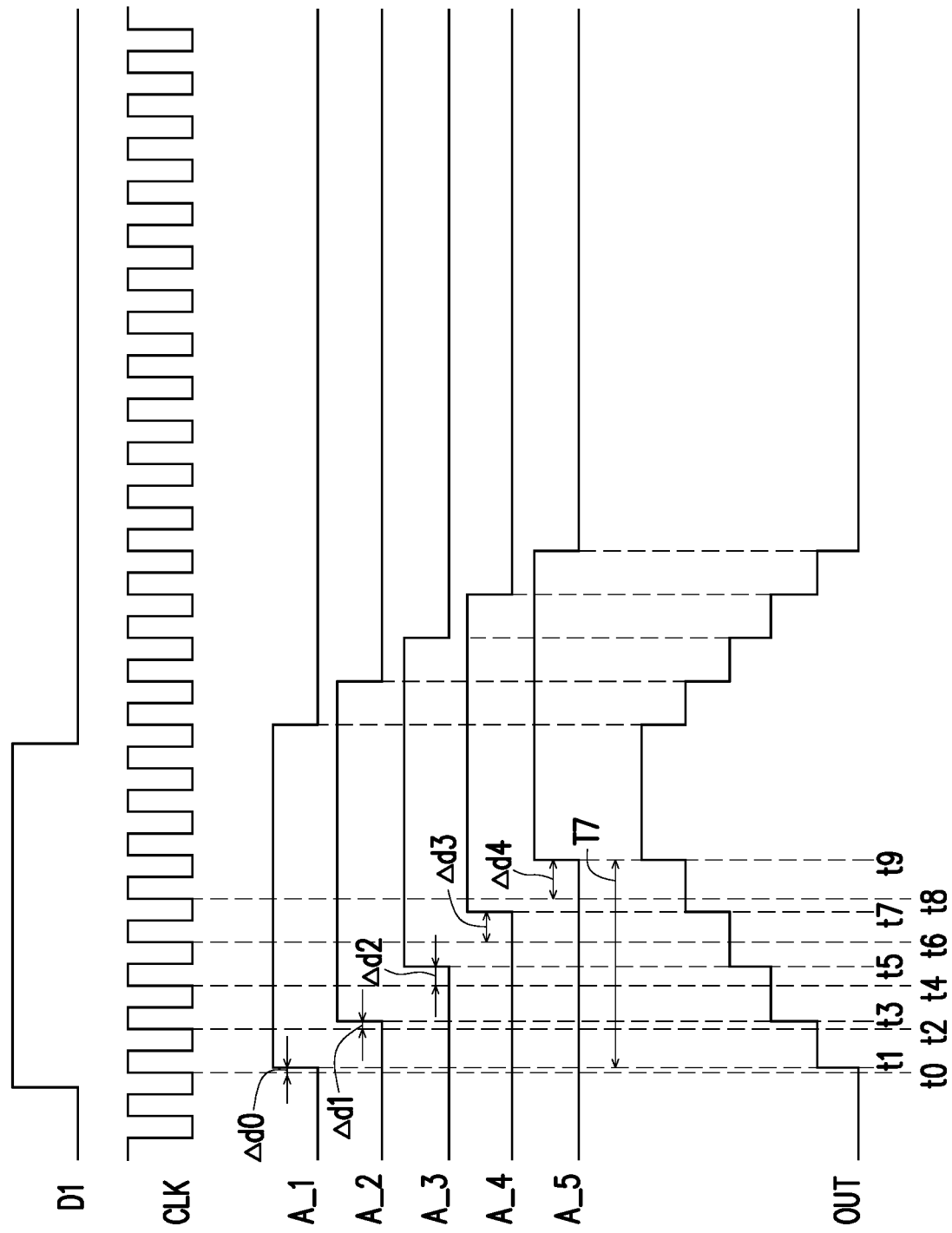
FIG. 7 is a timing diagram of an activation signal and an output signal according to an embodiment of the disclosure.

FIG. 7 is a timing diagram of an activation signal and an output signal according to an embodiment of FIG. 6. Referring to FIG. 6 and FIG. 7 together, the controllable delay circuits 101_1-101_5 output the activation signals A_1-A_5 by delaying time for the data signals L_1-L_5 to rise to a high level from a low level. At a time point to, the data signal L_1 rises to a high level, but the activation signal A_1 rises to a high level after delayed to a time point t1. At a time point t2, the data signal L_2 rises to a high level, but the activation signal A_2 rises to a high level after delayed to a time point t3. At a time point t4, the data signal L_3 rises to a high level, but the activation signal A_3 rises to a high level after delayed to a time point t5. At a time point t6, the data signal L_4 rises to a high level, but the activation signal A_4 rises to a high level after delayed to a time point t7. At a time point t8, the data signal L_5 rises to a high level, but the activation signal A_5 rises to a high level after delayed to a time point t9.

In the present example, a delay amount Δd0 between the time point t0 and the time point t1 is less than a delay amount Δd1 between the time point t3 and the time point t2. The delay amount Δd1 between the time point t3 and the time point t2 is less than a delay amount Δd2 between the time point t5 and the time point t4. The delay amount Δd2 is less than a delay amount Δd3 between the time point t7 and the time point t6. The delay amount Δd3 is less than a delay amount Δd4 between the time point t9 and the time point t8. The current source circuits 102_1-102_5 sequentially output unit currents in response to level switching of the activation signals A_1-A_5 at the time points t1, t3, t5, t7, and t9, so that the output signal OUT gradually rises within rising time T7. It thus can be seen that the rising time of the output signal OUT may be prolonged in response to the delay amounts of the controllable delay circuits 101_1-101_5 being gradually increased.

Figure 8:
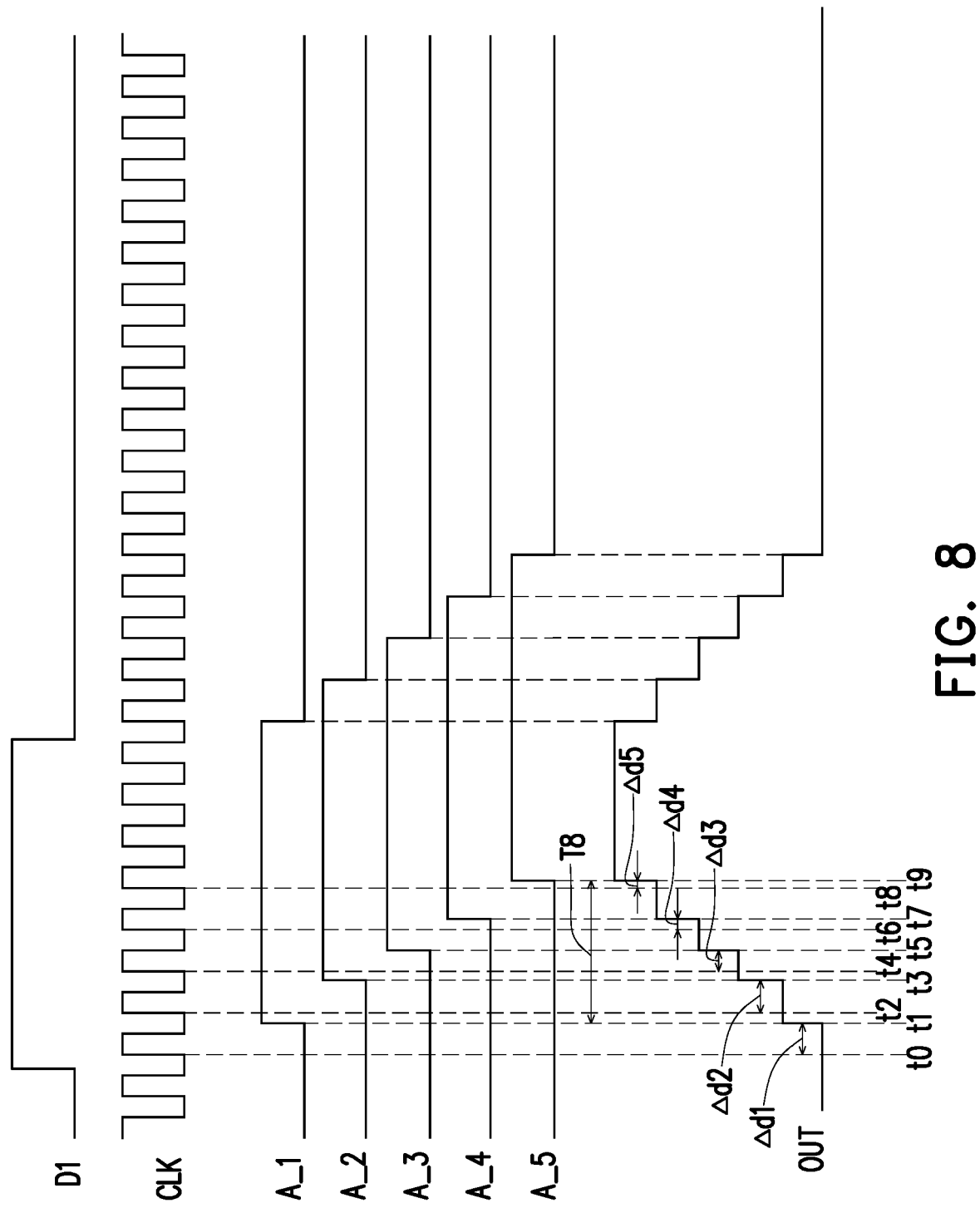
FIG. 8 is a timing diagram of an activation signal and an output signal according to an embodiment of the disclosure.

FIG. 8 is a timing diagram of an activation signal and an output signal according to an embodiment of FIG. 6. Referring to FIG. 6 and FIG. 8 together, the controllable delay circuits 101_1-101_5 output the activation signals A_1-A_5 by delaying time for the data signals L_1-L_5 to rise to a high level from a low level. At a time point t0, the data signal L_1 rises to a high level, but the activation signal A_1 rises to a high level after delayed to a time point t1. At a time point t2, the data signal L_2 rises to a high level, but the activation signal A_2 rises to a high level after delayed to a time point t3. At a time point t4, the data signal L_3 rises to a high level, but the activation signal A_3 rises to a high level after delayed to a time point t5. At a time point t6, the data signal L_4 rises to a high level, but the activation signal A_4 rises to a high level after delayed to a time point t7. At a time point t8, the data signal L_5 rises to a high level, and the activation signal A_5 rises to a high level after delayed to a time point t9.

In the present example, a delay amount Δd1 between the time point t1 and the time point t0 is greater than a delay amount Δd2 between the time point t3 and the time point t2. The delay amount Δd2 is greater than a delay amount Δd3 between the time point t5 and the time point t4. The delay amount Δd3 is greater than a delay amount Δd4 between the time point t7 and the time point t6. The delay amount Δd4 is greater than a delay amount Δd5 between the time point t9 and the time point t8. The current source circuits 102_1-102_5 sequentially output unit currents in response to level switching of the activation signals A_1-A_5 at the time points t1, t3, t5, t7, and t9, so that the output signal OUT gradually rises within rising time T8. It thus can be seen that the rising time of the output signal OUT may be shortened in response to the delay amounts of the controllable delay circuits 101_1-101_5 being gradually decreased.

In order to simplify the figures, it is only considered in the timing diagrams of the embodiments shown in FIG. 7 and FIG. 8 that the switches in the current source circuits 102_1-102_5 are PMOSs and the data signals L_1-L_5 are controlled from a low level to a high level. However, those of ordinary skill in the art can refer to the descriptions of the embodiments of FIG. 1 to FIG. 8 to know corresponding controls when the data signals L_1-L_5 are switched from a high level to a low level or the switches in the current source circuits 102_1-102_5 are NMOSs. The descriptions thereof are omitted herein.

Figure 9:
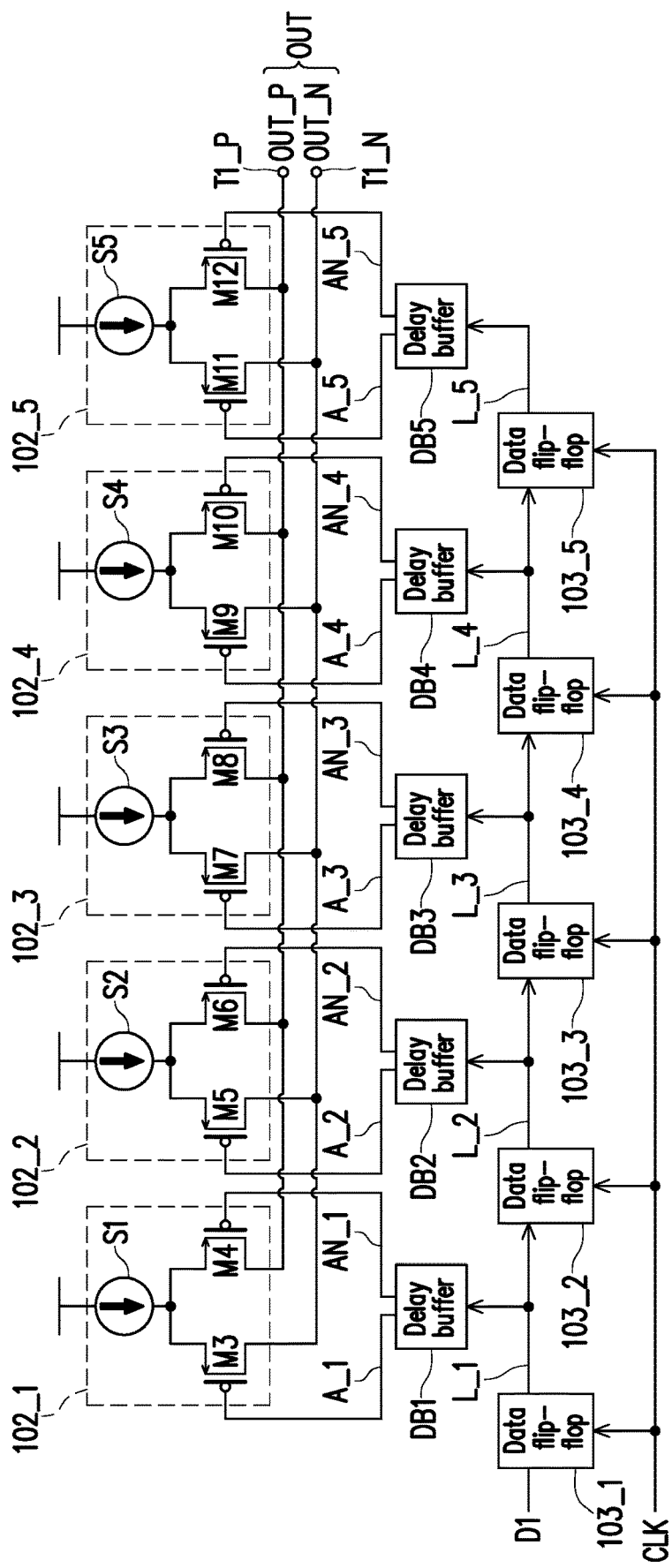
FIG. 9 is a schematic diagram of a control circuit for controlling rising time and falling time according to an embodiment of the disclosure.

However, in an embodiment of the disclosure, the output signal may be implemented in a differential form. With reference to FIG. 9, FIG. 9 is a schematic diagram of a control circuit for controlling rising time and falling time according to an embodiment of the disclosure. FIG. 9 is also described with an example that the output signal OUT is generated by superposing five unit currents I1-I5 (i.e., M=5). In the embodiment of FIG. 9, the controllable delay circuits 101_1-101_5 of FIG. 1 are implemented as controllable delay circuits 101_1-101_5.

By comparing FIG. 5 with FIG. 9, in the embodiment of FIG. 9, the output signal OUT is a differential signal, and thus includes a positive phase output signal OUT_P and a negative phase output signal OUT_N. Therefore, the controllable delay circuits 101_1-101_5 output inverted activation signals AN_1-AN_5 of the activation signals A_1-A_5 in addition to the activation signals A_1-A_5. The activation signals A_1-A_5 and the corresponding inverted activation signals AN_1-AN_5 are inverted from each other. For example, the activation signal A_1 and the inverted activation signal AN_1 are inverted from each other.

In the embodiment of FIG. 9, each of the current source circuits 102_1-102_5 includes two switches and a current source. For example, the current source circuit 102_1 includes switches M3 and M4 and a current source S1. The current source circuit 102_2 includes switches M5 and M6 and a current source S2. The current source circuit 102_3 includes switches M7 and M8 and a current source S3. The current source circuit 102_4 includes switches M9 and M10 and a current source S4. The current source circuit 102_5 includes switches M11 and M12 and a current source S5. In the present embodiment, the switches M3-M12 are PMOS transistors. In addition, the current sources S1-S5 may be obtained by a current mirror circuit.

In the embodiment of FIG. 9, the current source circuit 102_1 is taken for description. Control terminals of the switches M3 and M4 receive the activation signal A_1 and the inverted activation signal AN_1 respectively and are controlled by the activation signal A_1 and the inverted activation signal AN_1 respectively. Therefore, when the switch M3 is turned on, the switch M4 is turned off. When the switch M3 is turned off, the switch M4 is turned on. When the switch M3 is turned on, the unit current provided by the current source S1 is output to a positive phase output terminal T1_N. When the switch M4 is turned on, the unit current provided by the current source S1 is output to a negative phase output terminal T1_P. It is to be noted that turn-on time of the switches M3 and M4 depends on the delay amount of the controllable delay circuit 101_1. The other current source circuits 102_2-102_4 will also operate in the same manner.

Based on the same principle as in FIG. 5, the rising time and falling time of the negative phase output signal OUT_N may be independently adjusted. In contrast, the rising time and falling time of the positive phase output signal OUT_P may be independently adjusted. When the delay amounts of the controllable delay circuits 101_1-101_5 are gradually increased or gradually decreased, the rising time or the falling time will be prolonged or shortened.

Figure 10:
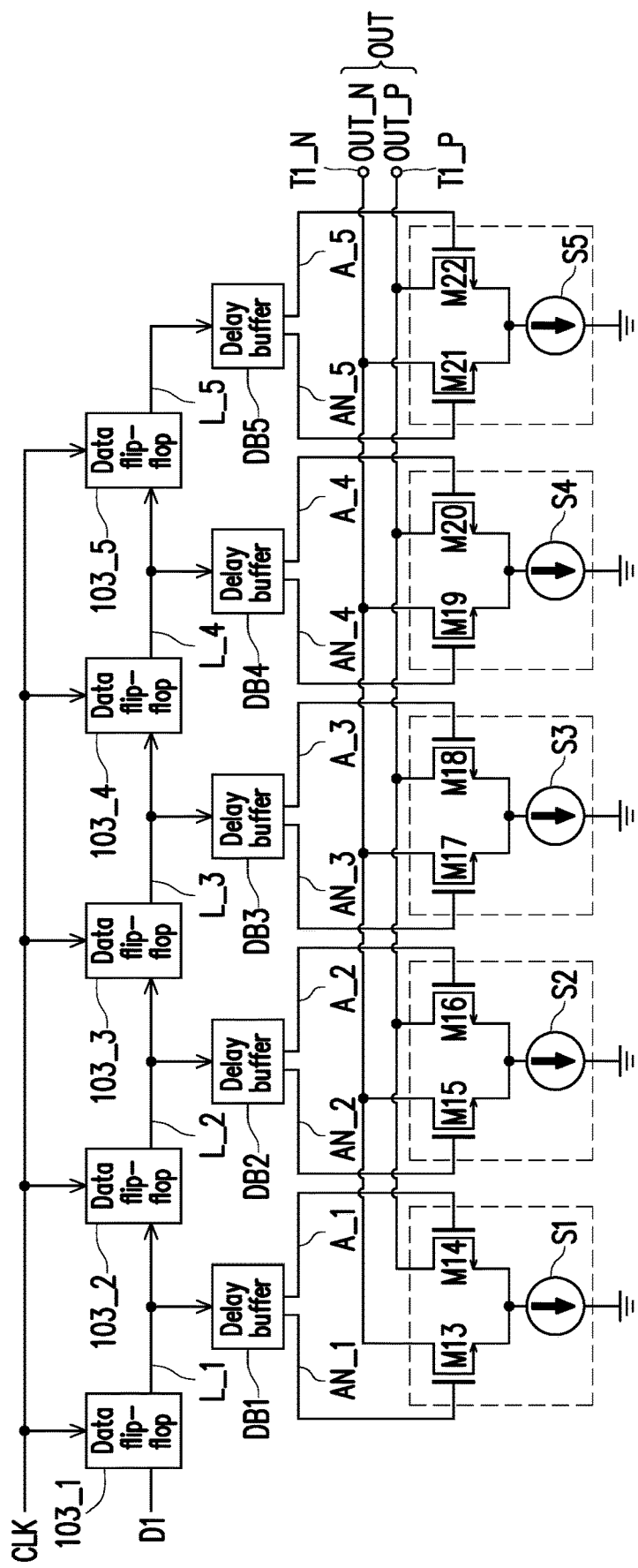
FIG. 10 is a schematic diagram of a control circuit for controlling rising time and falling time according to an embodiment of the disclosure.

Next, with reference to FIG. 10, FIG. 10 is a schematic diagram of a control circuit for controlling signal rising time and falling time according to an embodiment of the disclosure. By comparing FIG. 6 with FIG. 10, in the embodiment of FIG. 10, the output signal OUT is a differential signal, and thus includes a positive phase output signal OUT_P and a negative phase output signal OUT_N. Therefore, the controllable delay circuits 101_1-101_5 output inverted activation signals AN_1-AN_5 of the activation signals A_1-A_5 in addition to the activation signals A_1-A_5. The activation signals A_1-A_5 and the corresponding inverted activation signals AN_1-AN_5 are inverted from each other. For example, the activation signal A_1 and the inverted activation signal AN_1 are inverted from each other.

In the embodiment of FIG. 10, each of the current source circuits 102_1-102_5 includes two switches and a current source. For example, the current source circuit 102_1 includes switches M13 and M14 and a current source S1. The current source circuit 102_2 includes switches M15 and M16 and a current source S2. The current source circuit 102_3 includes switches M17 and M18 and a current source S3. The current source circuit 102_4 includes switches M19 and M20 and a current source S4. The current source circuit 102_5 includes switches M21 and M22 and a current source S5. In the present embodiment, the switches M13-M22 are NMOS transistors. In addition, the current sources S1-S5 may be obtained by a current mirror circuit.

It is to be noted that the difference between FIG. 9 and FIG. 10 lies in that the switches M13-M22 in the current source circuits 102_1-102_5 are NMOS transistors. The action of a circuit shown in FIG. 10 may be inferred by those skilled in the art with reference to the descriptions of FIG. 1 to FIG. 9. Similarly, in the example of FIG. 10, the rising time and falling time of the positive phase output signal OUT_P and the negative phase output signal OUT_N may be independently adjusted. When the delay amounts of the controllable delay circuits 101_1-101_5 are gradually increased or gradually decreased, the rising time or the falling time will be prolonged or shortened.

Based on the above, in the embodiments of the disclosure, in an application circuit for superposing signals in response to being triggered by a clock signal to generate an output signal, rising time or falling time may be independently adjusted to achieve asymmetry adjustment. In addition, by configuring a delay amount of each controllable delay circuit, an output signal matching specifications may be generated.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A control circuit for controlling signal rising time and falling time, comprising:
   series-connected M data flip-flops, configured to receive a clock signal and being triggered by the clock signal to sequentially output a plurality of data signals, wherein a data input terminal of the first data flip-flop of the M data flip-flops receives input data, and a data output terminal of the $N^{th}$ data flip-flop of the M data flip-flops is coupled to a data input terminal of the $(N+1)^{th}$ data flip-flop, wherein M and N are positive integers, and $1 \leq N < M$;
   M controllable delay circuits, coupled to data output terminals of the M data flip-flops, receiving the data signals and delaying generation of a plurality of activation signals, wherein a delay amount of each of the controllable delay circuits is configured to delay one of the activation signals; and M current source circuits, coupled to a signal output terminal, wherein each of the current source circuits is coupled to one of the controllable delay circuits to receive one of the activation signals and to determine whether to output a unit current to the signal output terminal according to a level of the received one of the activation signals, wherein rising time for an output signal of the signal output terminal to rise to a predetermined level or falling time for the output signal to fall to a predetermined level is determined according to a cycle time length of the clock signal and the delay amounts of the controllable delay circuits.

2. The control circuit for controlling signal rising time and falling time according to claim 1, wherein the delay amounts of the controllable delay circuits are different from each other.

3. The control circuit for controlling signal rising time and falling time according to claim 2, wherein the delay amount of the $i^{th}$ controllable delay circuit is greater than the delay amount of the $(i+1)^{th}$ controllable delay circuit, wherein i is a positive integer less than M.

4. The control circuit for controlling signal rising time and falling time according to claim 2, wherein the delay amount of the $i^{th}$ controllable delay circuit is less than the delay amount of the $(i+1)^{th}$ controllable delay circuit, wherein i is a positive integer less than M.

5. The control circuit for controlling signal rising time and falling time according to claim 1, wherein the $i^{th}$ controllable delay circuit comprises:
a delay buffer;
a first current limiting component, coupled to the delay buffer; and
a second current limiting component, coupled to the delay buffer,
wherein the delay buffer delays the $i^{th}$ data signal according to a delay amount generated by the first current limiting component or the second current limiting component to generate the $i^{th}$ activation signal, wherein i is a positive integer less than or equal to M.

6. The control circuit for controlling signal rising time and falling time according to claim 5, wherein the delay buffer comprises a first inverter and a second inverter, an output terminal of the first inverter is coupled to an input terminal of the second inverter, an input terminal of the first inverter receives one of the data signals, and an output terminal of the second inverter outputs one of the activation signals.

7. The control circuit for controlling signal rising time and falling time according to claim 5, wherein a first power terminal of the delay buffer is coupled to the first current limiting component.

8. The control circuit for controlling signal rising time and falling time according to claim 7, wherein the first current limiting component comprises a variable resistor, a variable capacitor, or a variable current source controlled by a first control signal, and the delay amount of the $i^{th}$ controllable delay circuit is determined according to a resistance value of the variable resistor, a capacitance value of the variable capacitor, or a current value of the variable current source.

9. The control circuit for controlling signal rising time and falling time according to claim 5, wherein a second power terminal of the delay buffer is coupled to the second current limiting component.

10. The control circuit for controlling signal rising time and falling time according to claim 7, wherein the second current limiting component comprises a variable resistor, a variable capacitor, or a variable current source controlled by a second control signal, and the delay amount of the $i^{th}$ controllable delay circuit is determined according to a resistance value of the variable resistor, a capacitance value of the variable capacitor, or a current value of the variable current source.

11. The control circuit for controlling signal rising time and falling time according to claim 1, wherein each of the current source circuits comprises a current source and a transistor, a first terminal of the transistor is coupled to an output terminal of the current source, a second terminal of the transistor is coupled to the signal output terminal, and a control terminal of the transistor receives one of the activation signals.

* * * * *